United States Patent
Cabral, Jr. et al.

(10) Patent No.: US 6,444,578 B1
(45) Date of Patent: Sep. 3, 2002

(54) SELF-ALIGNED SILICIDE PROCESS FOR REDUCTION OF SI CONSUMPTION IN SHALLOW JUNCTION AND THIN SOI ELECTRONIC DEVICES

(75) Inventors: Cyril Cabral, Jr., Ossining; Roy Arthur Carruthers, Stormville; Kevin K. Chan, Staten Island; Guy M. Cohen, Mohegan Lake; Kathryn Wilder Guarini; James M. Harper, both of Yorktown Heights; Christian Lavoie, Ossining; Paul M. Solomon, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/791,024

(22) Filed: Feb. 21, 2001

(51) Int. Cl.[7] ............................................. H01L 21/44
(52) U.S. Cl. ....................... 438/682; 438/655; 438/597; 438/630

(58) Field of Search ................................. 438/597, 660, 438/663, 664, 682, 683, 685, 686, 630, 649, 655

(56) References Cited

U.S. PATENT DOCUMENTS

| | | | |
|---|---|---|---|
| 5,849,630 A | * 12/1998 | Johnson ....................... | 438/606 |
| 6,187,617 B1 | * 2/2001 | Gauthier, Jr. et al. ........ | 438/197 |
| 6,323,130 B1 | * 11/2001 | Brodsky et al. ............. | 438/682 |
| 6,331,486 B1 | * 12/2001 | Cabral, Jr. et al. ........... | 438/682 |
| 6,346,477 B1 | * 2/2002 | Kaloyeros et al. ........... | 738/680 |

* cited by examiner

*Primary Examiner*—Wael Fahmy, Jr.
*Assistant Examiner*—Fernando Toledo
(74) *Attorney, Agent, or Firm*—Scully, Scott, Murphy & Presser; Robert M. Trepp (57) ABSTRACT

The present invention relates to a method of reducing Si consumption during a self-aligned silicide process which employs a M—Si or M—Si—Ge alloy, where M is Co, Ni or CoNi and a blanket layer of Si. The present invention is particularly useful in minimizing Si consumption in shallow junction and thin silicon-on-insulator (SOI) electronic devices.

50 Claims, 6 Drawing Sheets

SELF-ALIGNED SILICIDE PROCESS FOR REDUCTION OF SI CONSUMPTION IN SHALLOW JUNCTION AND THIN SOI ELECTRONIC DEVICES

DESCRIPTION

Field of the Invention

The present invention relates to a method of forming ohmic contacts for a semiconductor device, and more particularly to a self-aligned silicide process, i.e., salicide process, which substantially minimizes silicon (Si) consumption in shallow junction and thin silicon-on-insulator (SOI) electronic devices.

BACKGROUND OF THE INVENTION

As the miniaturization of microelectronic devices progresses, it is becoming increasingly difficult to form low resistivity (on the order of 25 $\mu$ohm·cm or below) silicide contacts to the source, drain and gate of the transistor. In the next generation of devices and beyond, one of the major challenges for silicidation is to keep the low resistivity of the silicide by maintaining its thickness, while reducing consumption of Si during silicidation. Since the dopant distribution is now extremely shallow (on the order of a few tens of nanometers or below), standard silicide processes consume a major part of the Si in the junction. Also, for devices manufactured on thin SOI substrates, the amount of Si available for the silicide reaction is very limited. It is therefore necessary to devise a method to reduce consumption of the Si substrate.

In the current self-aligned cobalt silicide process, a TiN/Co film is deposited over the devices and annealed to form cobalt monosilicide over exposed Si regions (i.e., source, drain and gate) of the transistors. A selective wet etch is then performed to remove the TiN cap and the non-reacted cobalt left over the oxide or nitride regions. The cobalt monosilicide is then annealed to form the cobalt disilicide. The final cobalt disilicide formed is 3.5 times thicker than the initial cobalt film deposited and the reaction consumed an even thicker layer of Si (3.6 times the initial cobalt film) so that the surface of the silicide is slightly below the original Si surface.

Many options have been proposed to limit the Si consumption of the Si substrate. One strategy relied on the selection of different metal silicides that would form with a lower amount of Si consumption. This is the case in nickel monosilicide. Comparing the phases of the Ni—Si and Co—Si systems, one finds that the lowest resistivity phase for each system is NiSi and $CoSi_2$. The lower concentration of Si in NiSi compared to $CoSi_2$ results in a lower consumption of Si for silicide formation with the same low sheet resistance. However, NiSi brings other concerns about the processing (that are non-existent with a $CoSi_2$ process) such as a major reduction in thermal budget after silicidation brought about by both the possible formation of higher resistivity $NiSi_2$ and the morphological stability of the film.

A second strategy for limiting substrate and junction consumption is to have a secondary source of Si. This had been proposed and can be done in many different ways. Each prior art method must be consistent with the self-aligned process. The Si can be added first to the exposed Si regions alone using selective epitaxy before metal deposition. It can also be deposited simultaneously with the metal in a selective chemical vapor deposition (CVD) process. More recently, it has been suggested that the Si be added during silicidation, after the selective etch of the non-reacted metal. The Si is deposited as a blanket film above cobalt monosilicide or the metal-rich silicide. During the second anneal of the process, the formation of $CoSi_2$ can at least in part come from the reaction with the top Si film helping in reducing Si consumption of the substrate.

Despite the advances made in this field, there is still a need for developing a new and improved self-aligned silicide process which is capable of substantially reducing Si consumption in shallow junction devices as well as thin SOI electronic devices.

SUMMARY OF THE INVENTION

One object of the present invention is to provide a silicidation process which substantially reduces the amount of Si consumed in the source, drain and gate regions of semiconductor electronic devices during silicidation.

A further object of the present invention is to provide a self-aligned suicide process (i,e., salicide process) that includes materials and processing steps that are compatible with existing semiconductor device technologies.

An even further object of the present invention is to provide a method of forming an ohmic contact (i.e., a silicide region) that is present on the surface of Si in its lowest resistivity phase.

An additional object of the present invention is to provide a method of forming ohmic, contacts which does not necessarily increase the thermal budget of the process.

These and other objects and advantages art achieved in the present invention by employing a method which includes the use of a metal alloy layer and a blanket layer of Si. Specifically, one method of the present invention includes forming a first layer over a semiconductor wafer including at least exposed silicon-containing areas that are not covered by an insulator. The first layer comprises a M—Si G alloy, wherein M is Co, Ni or a combination of Co and Ni, where Si is less than 30 atomic % and Ge is less than 20 atomic %. Next, the first layer is subjected to a first annealing step which forms a metal rich silicide phase of $Co_2Si$ or $Ni_xSi_y$ over the exposed silicon-containing areas, wherein x and y are integers in which x is greater than y and Ge is partly in solution and partly segregates out of the silicide phase. The segregated Ge functions to substantially reduce silicon diffusion from the silicon-containing areas to the silicide during phase transformations in a subsequent second annealing step. After performing the first annealing step, any ureacted M—Si—Ge-alloy present on the semiconductor wafer is etched and thereafter a blanket layer of Si is formed over the silicide and the semiconductor wafer. A second annealing is then performed which converts the metal rich silicide phase into its lowest resistance phase Any remaining non-reacted Si is then removed.

In another aspect of the preset invention a method of fob an ohmic contact to a SiGe alloy exposed in an opting trough an insulator is provided. Specifically, this method of the present invention includes forming a first blanket layer over a semiconductor wafer including at least an exposed Si—Ge alloy not covered by an insulator. In accordance with the present invention, the first layer comprises a M—Si alloy, wherein M is Co, Ni or a combination of Co and Ni, and Si is less than 30 atomic %. The first layer is then subjected to a first annealing step which forms a metal rich silicide phase of $Co_2Si$ or $Ni_xSi_y$, whew x and y are integers in which x>y. The SiGe alloy functions to substantially reduce Si diffusion from the SiGe alloy area to the silicide during phase transformations in a subsequent second annealing step. Any unreacted M—Si alloy present on the semiconductor wafer is then etched away and thereafter a blanket layer of Si Is formed over the silicide and the semiconductor wafer. A second annealing is then performed to convert the silicide into its lowest resistance silicide phase and thereafter any remaining non-reacted Si is removed. Note this aspect of the present invention differs from the previous aspect in that the metal alloy is M—Si, other than M—Si—Ge.

In both of the above-described methods wherein Co is employed; the first annealing step may form Co monosilicide rather than the metal rich silicide phase of Co. In this embodiment, the second annealing step converts Co monosilicide to Co disilicide.

DETAILED DESCRIPTION OF THE INVENTION

The present invention which provides a self-aligned silicide process for the reduction of Si consumption in shallow junction and thin SOI electronic devices will now be described in greater detail by referring to the drawings that accompany the present application. It should be noted that in the accompanying drawings like and/or corresponding elements are referred to by like reference numerals.

Reference is first made to FIGS. 1A–1G which illustrate the basic processing steps of the present invention that are employed in forming an ohmic contact to a Si-containing area exposed in an opening through an insulator. In accordance with the present invention, the ohmic contact is formed utilizing a self-aligned silicide process which includes both a M—Si—Ge alloy and a blanket layer of Si.

Figure 1A:
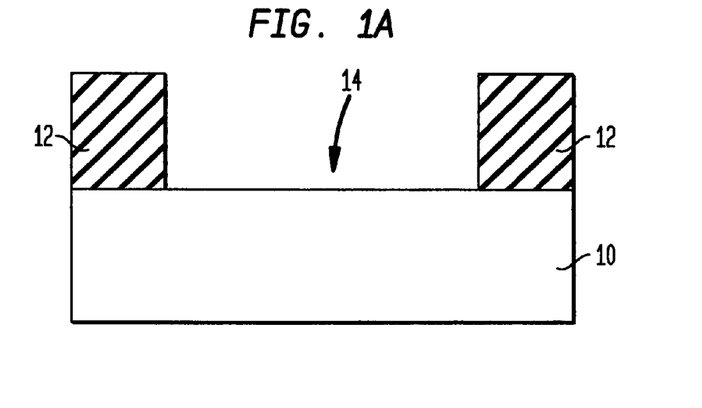
FIGS 1A–1G show the basic processing steps of one method of the present invention wherein an ohmic contact is formed over a silicon-containing area exposed in an opening through an insulator using a M—Si—Ge alloy and a blanket layer of Si.

Specifically, the structure shown in FIG. 1A comprises a semiconductor wafer that includes a Si-containing substrate 10 which has patterned insulator 12 formed therein. Suitable Si-containing substrates that can be employed in the present invention include, but are not limited to: single crystal silicon, polycrystalline Si, SiGe, amorphous Si, silicon-on-insulator (SOI) and other like Si-containing substrates. The patterned insulator is comprised of any organic or inorganic dielectric material which is well known to those skilled in the art including high-k dielectrics and low-k dielectrics. The type of insulator employed is not critical to the present invention.

The structure shown in FIG. 1A is fabricated using processing techniques well known to those skilled in the art For example, a layer of insulator is formed on the surface of substrate 10 utilizing a conventional deposition process such as chemical vapor deposition (CVD), plasma enhanced CVD, spin-on coating, chemical solution deposition, and other like deposition processes. The patterned insulator includes at least one opening 14 which exposes an area of substrate 10 in which an ohmic contact is to be formed. The patterned insulator containing the at least one opening is formed by conventional lithography and etching. The etching process employed in forming the patterned insulator is highly selective for removing insulator as compared to substrate. It should be noted that a thin oxide layer (not shown) may be present on the surface of the substrate prior to, or after formation of the patterned insulator. In embodiments wherein the oxide is not desirable, the oxide may be removed utilizing a wet etch process.

The Si-containing substrate may be doped or undoped and it may contain various isolation and device regions therein. For clarity, these various regions are not shown in the drawings of the present invention, but are meant to be included within region 10.

Figure 1B:
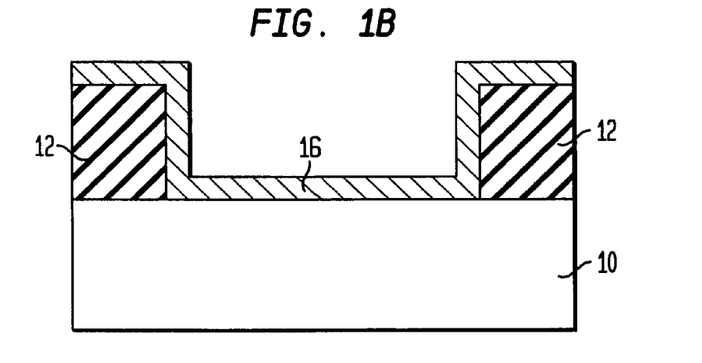

Next, as shown in FIG. B, first layer 16 is formed over the entire semiconductor wafer including the exposed substrate and insulator utilizing a conventional blanket deposition process such as CVD, plasma-assisted CVD, evaporation, sputtering and other like deposition processes. Of these various deposition processes, it is preferred to form first layer 16 by a sputtering process. Alternatively, first layer 16 may be formed by first depositing a metal layer on the semiconductor wafer, and thereafter doping the metal layer with Si and Ge utilizing conventional ion implantation processes well known to those skilled in the art.

Notwithstanding which of the above techniques is employed in forming first layer 16, the first layer is comprised of a M—Si—Ge alloy, wherein M is selected from the group consisting of Co, Ni and a combination of Co and Ni. Of the various metals for M, it is preferred in the present invention to form Co-Si—Ge alloys.

In accordance with the present invention, Si is present in the alloy in an amount of less than about 30 atomic % and Ge is present in the alloy in an amount of less than about 20 atomic %. In a preferred embodiment of the present invention, Si is present in the alloy in an amount of from about 15 to about 25 atomic % and Ge is present in the alloy in an amount of from about 2 to about 10 atomic %.

The M—Si—Ge alloy of the present invention (i.e., first layer 16) may also include at least one of the following additives: C, Al, Sc, Ti, V, Cr, Mn, Fe, Cu, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb and Lu. Of these alloy additives, C, Al, Sc, Ti, V, Cr, Mn, Fe, Cu, Y, Zr, Nb, Mo, Ru, Rh, Pd, In, Sn, La, Hf. Ta, W, Re, Ir, Pt or mixtures thereof are highly preferred, with Ti, V, Cr, Nb, Rh, Ta and Re being more highly preferred.

When an additive is present in the M—Si—Ge alloy, the at least one alloy additive is present in an amount of up to about 30 atomic %, with a range of from about 0.1 to about 10 atomic % being more preferred Mixtures of one or more additives is also contemplated herein.

The term "M—Si—Ge alloy" is used herein to denote compositions that have a uniform or non-uniform distribution of Ge and Si therein; compositions that have a gradient distribution of Si and Ge therein; or mixtures and compounds thereof.

Figure 1C:
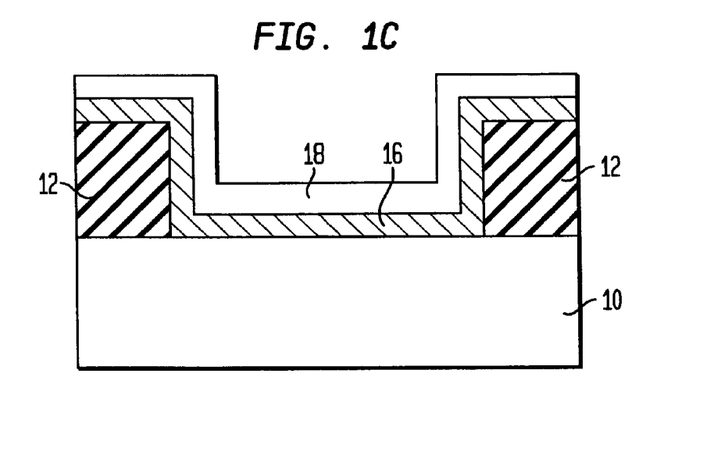
Figure 1D:
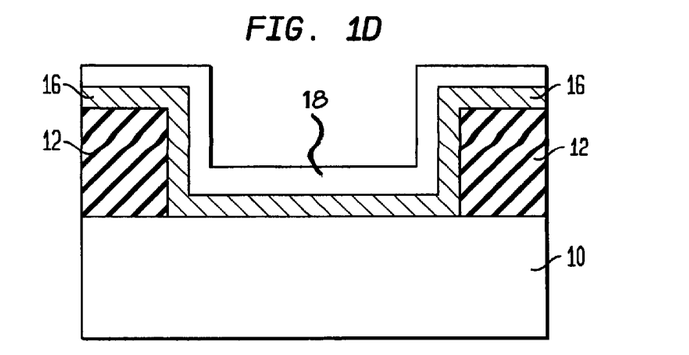

Next, as shown in FIG. 1C, an optional oxygen barrier layer 18 may be formed on the surface of M—Si—Ge alloy (i.e., first layer 16). The optional oxygen barrier layer is formed using a conventional blanket deposition process well known to those skilled in the art, including, but not limited to: CVD, plasma-assisted CVD, sputtering, plating, spin-on coating and other like deposition processes. The thickness of the optional oxygen barrier layer is not critical to the present invention as along as the oxygen barrier layer is capable of preventing oxygen or another ambient gas from diffusing into the structure. Typically, the optional oxygen barrier layer has a thickness of from about 10 to about 30 nm.

The optional oxygen barrier layer is composed of conventional materials that are well known to those skilled in the art for preventing oxygen from diffusing into the structure. For example, Ti, $Si_3N_4$, TaN, W and other like materials can be employed in the present invention. Although the remaining drawings of the present invention do not depict the presence of the optional oxygen barrier layer, it is possible to employ the method of the present invention when such a barrier layer is present.

The structure shown in FIG. 1B (or optionally FIG. 1C) is then subjected to a first annealing step so as to convert the M—Si—Ge alloy (i.e., first layer 16) into a metal rich silicide phase 20; See FIG. 1D. In accordance with the present invention, the metal rich silicide phase is comprised of $Co_2Si$, or $Ni_xSi_y$ (where x and y are integers in which x is greater than y) and Ge is partly in solution and partly segregates out of the silicide phase. It is noted that segregated Ge serves to substantially reduce Si diffusion from the Si-containing substrate to the silicide during phase transformations which occur in the second annealing step to be mentioned in greater detail hereinbelow. Moreover, the segregated Ge forms a SiGe interlayer between the Si-containing substrate and the metal rich phase. For clarity the SiGe interlayer is not shown in the drawings.

In some embodiments wherein a Co alloy is employed, the first annealing step may form Co monosilicide instead of the metal rich phase.

Specifically, the first annealing step of the present invention is carried out using a rapid thermal anneal (RTA) process using a gas atmosphere such as He, Ar, $N_2$ or forming gas such as $H_2+N_2$ or $H_2+Ar$. The RTA is carried out at a temperature of from about 300° to about 700° C. for a time period of about 300 seconds or less using a continuous heating regime or a ramp and soak heating regime. Other temperatures and times are also contemplated herein so long as the conditions chosen are capable of performing the aforesaid functions.

After conducting the first annealing step, optional oxygen diffusion barrier and any remaining M—Si—Ge alloy 16 (or pure metal) is removed from the structure (See, FIG. 1E) using a conventional etching process that is capable of removing the above mentioned layers. Specifically, the optional oxygen barrier layer and any remaining M—Si—Ge alloy may be removed by utilizing a chemical wet etch process. Conventional chemical etchants that are well known to those skilled in the art that are highly selective in removing the optional oxygen barrier layer and the M—Si—Ge alloy as compared to the metal rich silicide phase can be employed in the present invention. A suitable etchant that may be employed in the present invention is a mixture of hydrogen peroxide and nitric or sulfuric acid. Other chemical etchants can also be employed so long as they have a high selectivity for removing the optional oxygen barrier layer and M—Si—Ge alloy as compared to the metal rich silicide phase provided in the first annealing step mentioned above.

Figure 1E:
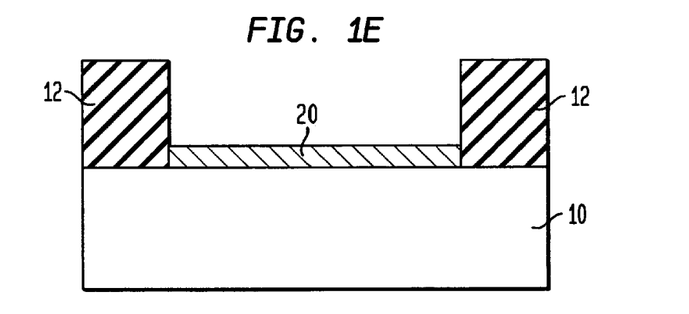

It is also within the contemplation of the present invention to employ a dry etching process in removing the optional oxygen barrier layer and the M—Si—Ge alloy from the structure. Suitable dry etching processes that may be employed in the present invention include, but are not limited to: reactive-ion etching (RIE), ion-beam etching (IBE), plasma-etching and other like dry etching processes.

In an optional, but highly preferred step of the present invention, the surface of the structure may now be cleaned to remove any oxides, nitrides and carbon present at the surface of the silicide. This optional step of the present invention may be carried out with an acid such as HF, hot $H_3PO_4$ or an in-situ cleaning process such as sputter etching before proceeding to the next step of the present invention.

Figure 1F:
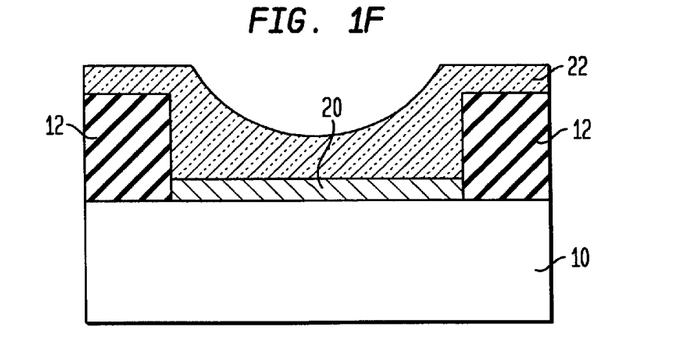

After ensuring that there is no non-reacted M—Si—Ge alloy (and optional oxygen barrier layer) left in the structure, a blanket layer of Si 22 is formed over the metal rich silicide phase provided by the first annealing step, See FIG. 1F. It is noted that the blanket layer of Si is also formed over patterned insulator 12. The blanket layer of Si is comprised of poly-Si, amorphous Si or any other Si-containing layer which can be used in the next annealing step of the present invention. The blanket layer is formed utilizing any conventional blanket deposition process such as CVD or sputtering.

A second annealing step is then performed to the structure shown in FIG. 1F so as to convert the metal rich silicide phase into a silicide region 24 (See, FIG. 1G) which is in its lowest resistance silicide phase. For example, metal rich silicide phase is transformed into one of the following silicide phases: $CoSi_2$, $Co_pNi_{(1-p)}Si_2$ where p is greater 0 to less than or equal to 0.5, $Co_pNi_{(1-p)}Si$ where p is equal to or greater than 0.5 to less than 1, or NiSi. It is noted that $Co_pNi_{(1-p)}Si_2$ and $Co_pNi_{(1-p)}Si$ represent the lowest resistance phases of CoNi that may be formed during the second anneal. Moreover, the value of p may be ±0.2 from the value given above.

In accordance with the present invention, the second annealing step is carried out at a higher annealing temperature than the first annealing step. By carrying out the second annealing step at higher temperatures than the first annealing step, transformation of the metal rich silicide phase to the lowest resistance silicide phase occurs. The second annealing step is also carried out by RTA using one of the previously mentioned gas atmospheres. Typically, the second annealing step is carried out at a temperature of about 600° to about 900° C. for a time period of about 100 seconds or less using a continuous heating regime or a ramp and soak heating regime. Other annealing temperatures and times are also contemplated herein so long the conditions are capable of carrying out the aforementioned transformation from the metal rich silicide phase to the lowest resistance silicide phase.

In one embodiment of the present invention, the steps of forming a blanket layer of Si and second annealing are performed concurrently. This is accomplished by selecting a substrate temperature during the deposition of the blanket layer of Si wherein silicide phase formation occurs in-situ. Typically, this may occur when a substrate temperature of from about 600° to about 900° C. is employed during the blanket deposition of the Si layer.

It is noted that if substrate 10 was not previously doped, it can be doped after either the first or second annealing steps using conventional techniques that are well known to those skilled in the art.

Figure 1G:
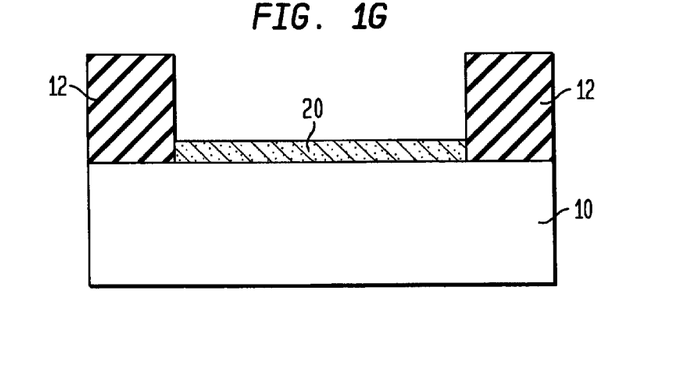

Following the second annealing step, any non-reacted Si is removed from the structure utilizing an etching process which has a high selectivity for removing Si as compared to silicide so as to provide the structure shown in FIG. 1G. One possible etchant that can be employed in this step of the present invention is trimethylammonium hydroxide (TMAH).

The advantage of the present invention over prior art methods, is that during the salicidation process, substantially little or no consumption of substrate 10 occurs. The substantial minimization of Si consumption afforded by the inventive method is a result of using both the metal alloy layer and the blanket layer of Si.

It is noted that the method employed above in FIGS. 1A–1G employs a M—Si—Ge alloy layer, a Si-containing substrate and a blanket layer of Si. The following description with reference to FIGS. 2A–2G employs a Si—Ge alloy as a substrate, a M—Si alloy and a blanket layer of Si. Specifically, the structure shown in FIG. 2A is identical to that shown in FIG. 1A above expect that substrate 11 is a SiGe alloy or a Si substrate containing a Ge implant Thus, the above mentioned processes and materials are applicable for this aspect of the present invention.

Figure 2A:
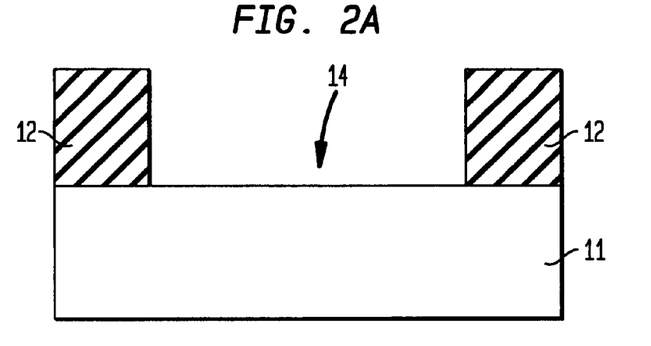
FIGS. 2A–2G show the basic processing steps of the present invention wherein an ohmic contact is formed over a SiGe area exposed in an opening through an insulator using a M—Si alloy and a blanket layer of Si.
Figure 2B:
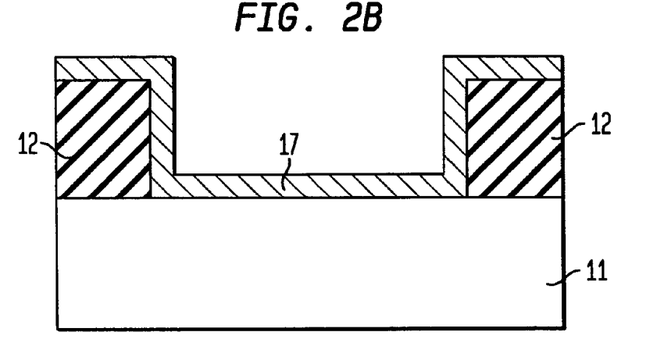

Following the formation of the structure shown in FIG. 2A, a first layer 17 of M—Si alloy wherein M is selected from the group consisting of Co, Ni and a combination of Co and Ni is deposited using the above-mentioned deposition processes. Of the various metals for M, it is preferred in the present invention to form Co—Si alloys. The resultant structure is shown in FIG. 2B. In accordance with the present invention, Si is present in the alloy in an amount of less than about 30 atomic % and even more preferably Si is present in the alloy in an amount of from about 15 to about 25 atomic %.

The M—Si alloy of the present invention (i.e., first layer 17) may also include at least one of the following additives: C, Ge, Al, Sc, Ti, V, Cr, Mn, Fe, Cu, Y, Zr, Nb, Mo, Ru, Rh, Pd, In, Sn, La, Hf. Ta, W, Re, Ir, Pt, Ce, Pr, Nd, Sm, Eu, Gd, Th, Dy, Ho, Er, Tm, Yb and Lu. Of these alloy additives, C, Ge, Al, Sc, Ti, V, Cr, Mn, Fe, Cu, Y, Zr, Nb, Mo, Ru, Rh, Pd, In, Sn, La, Hf. Ta, W, Re, Ir, Pt or mixtures thereof are highly preferred, with Ti, Ge, V, Cr, Nb, Rh, Ta and Re being more highly preferred.

When an additive is present in the M—Si alloy, the at least one alloy additive is present in an amount of from up to about 30 atomic %, with a range of from about 0.1 to about 10 atomic % being more preferred. Mixtures of one or more additives is also contemplated herein.

The term "M—Si alloy" is used herein to denote compositions that have a uniform or non-uniform distribution of Si therein; compositions that have a gradient distribution of Si therein; or mixtures and compounds thereof.

Figure 2C:
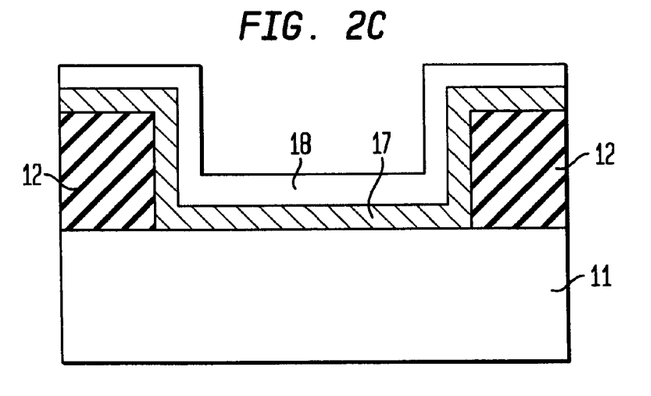
Figure 2D:
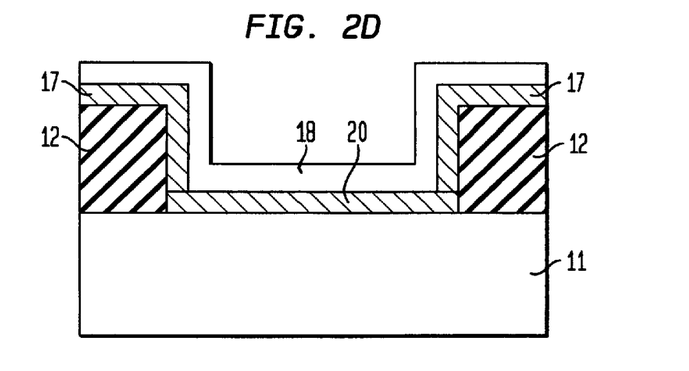
Figure 2E:
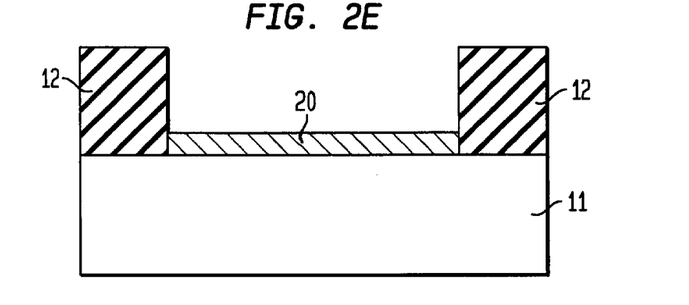

Next, as shown in FIG. 2C, an optional oxygen barrier layer 18, as discussed hereinabove, may be formed on the surface of the M—Si alloy (i.e., first layer 17).

The structure shown in FIG. 2B (or optionally FIG. 2C) is then subjected to a first annealing step so as to convert the M—Si alloy into a metal rich silicide phase 20; See FIG. 2D. In accordance with the present invention, the metal rich silicide phase is comprised of $Co_2Si$, or $Ni_xSi_y$ (where x and y are integers in which x is greater than y). Moreover, during this annealing step a SiGe alloy forms which functions to substantially reduce Si diffusion from the SiGe alloy area into the resultant silicide. As previously indicated, Ge is partly in solution and partly segregates out of the silicide phase. In embodiments wherein a Co alloy is employed, the first annealing step may form Co monosilicide rather than the metal rich phase.

Specifically, the first annealing step of the present invention is carried out using the various conditions mentioned hereinabove. After conducting the first annealing step, optional oxygen diffusion barrier and any remaining M—Si alloy 17 (or pure metal) is removed from the structure (See, FIG. 2E) using the processing technique mentioned above. In an optional step of the present invention, the surface of the structure is cleaned to remove any oxide, nitride or carbon that may be present therein.

Figure 2F:
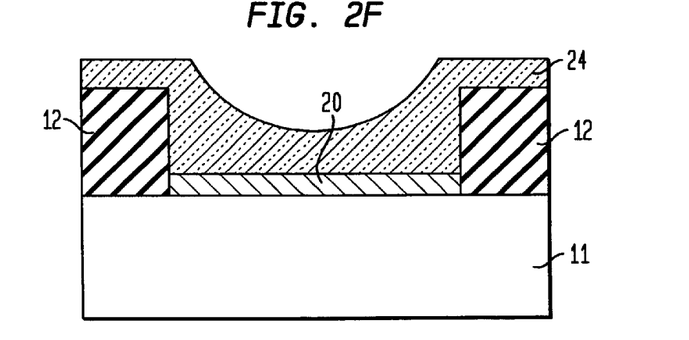
Figure 2G:
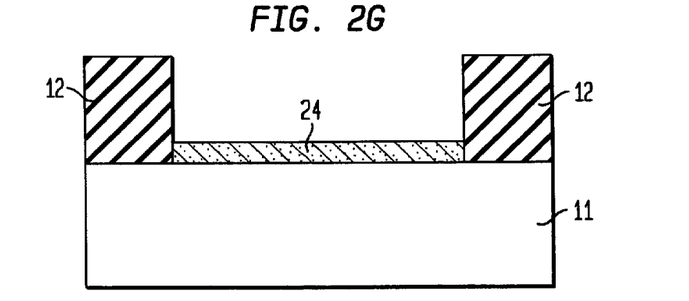

After removing the non-reacted M—Si alloy (and optional oxygen barrier layer), a blanket layer of Si 22, as mentioned above, is formed over the metal rich silicide phase fee provided by the first annealing step, See FIG. 2F. A second annealing step using conditions mentioned previously herein is then performed on the structure shown in FIG. 2F so as to convert the metal rich silicide phase into a silicide region 24 which is in its lowest resistance silicide phase. Following the second annealing step, any unreacted Si is removed from the structure utilizing an etching process which has a high selectivity for removing Si as compared to silicide so as to provide the structure shown in FIG. 2G.

The following examples are given to illustrate the present invention as well as some advantages that can be obtained from the same.

EXAMPLES

Figure 3A:
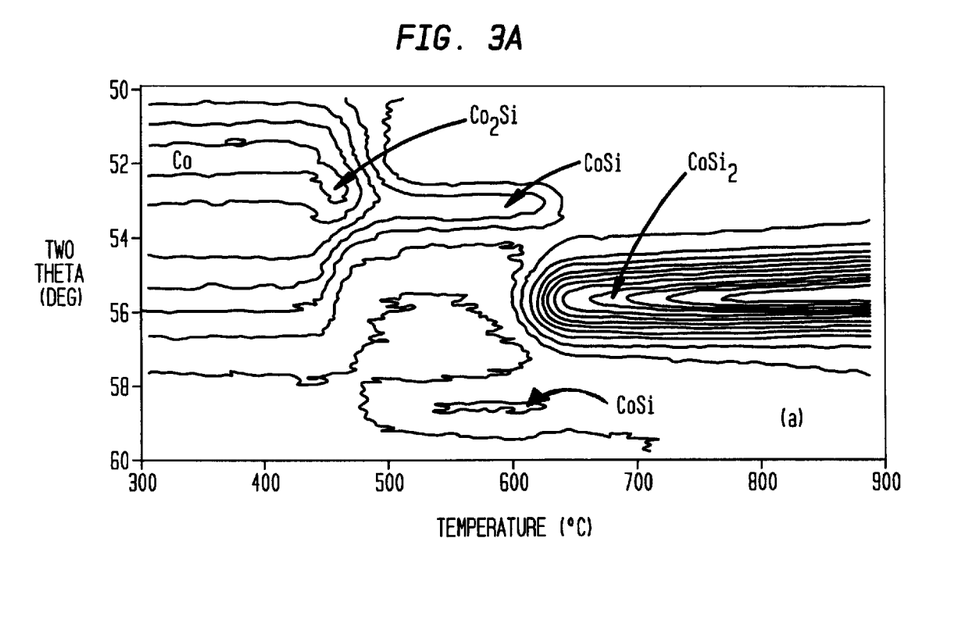
FIGS. 3A–3B are X-ray diffraction analysis as a function of temperature for $CoSi_2$ formation from a pure Co film (A), and from a Co—Si alloy (B) on Si substrates.

In these examples, the effects of using a ternary alloy (Co—Si—Ge) and a binary alloy (Co—Si) were investigated by following the phase formation in-situ during annealing of a $Co_{0.75}Si_{0.20}Ge_{0.05}$ as alloy sputter deposited on Si(100) substrates. Eight nanometer (8 nm) alloy films were deposited and were capped with a 20 nm TiN layer to prevent oxidation during annealing. The phase sequence was studied using in-situ X-ray diffraction where a 10° diffraction spectrum was taken every 1.5° C. during the anneal. The results of this study are shown in FIG. 3A. Specifically, in FIG. 3A, the phase sequence is presented for a bilayer of TiN and pure Co on a Si (100) substrate annealed at 3° C./second. The Co(002) peak can be observed around 52° 2θ up to 450° C. From 445° C. to about 475° C., the film is in the metal rich phase as shown by the $Co_2Si(301)$ peak at a slightly higher angle (about 52.5°). From 475° C. to about 620° C., two monosilicide peaks are observed at about 53° (CoSi (210)) and at about 58.5° (CoSi(211)). The transformation to the $CoSi_2$ is clearly seen by the appearance of the strong $CoSi_2(220)$ peak at about 55.5°.

Figure 3B:
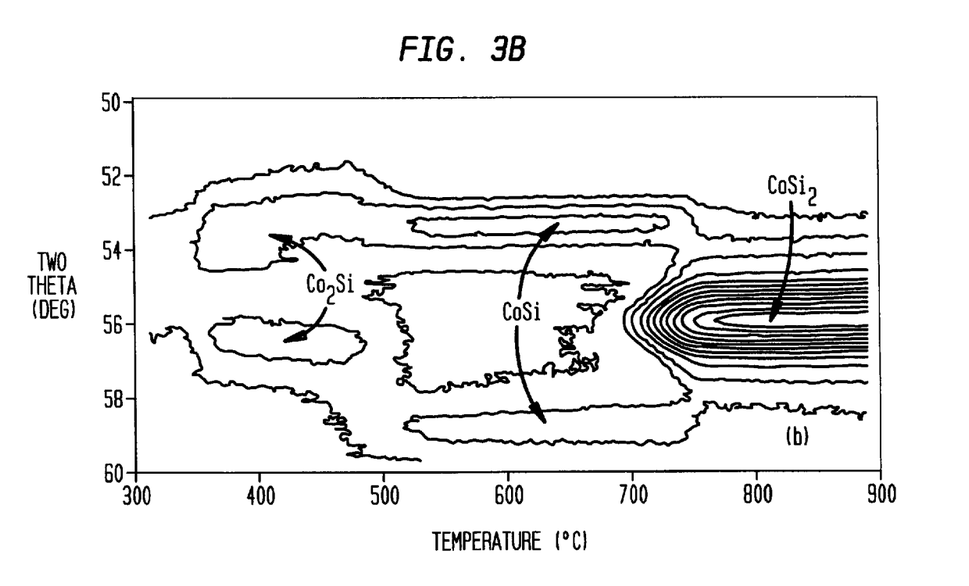
Figure 4A:
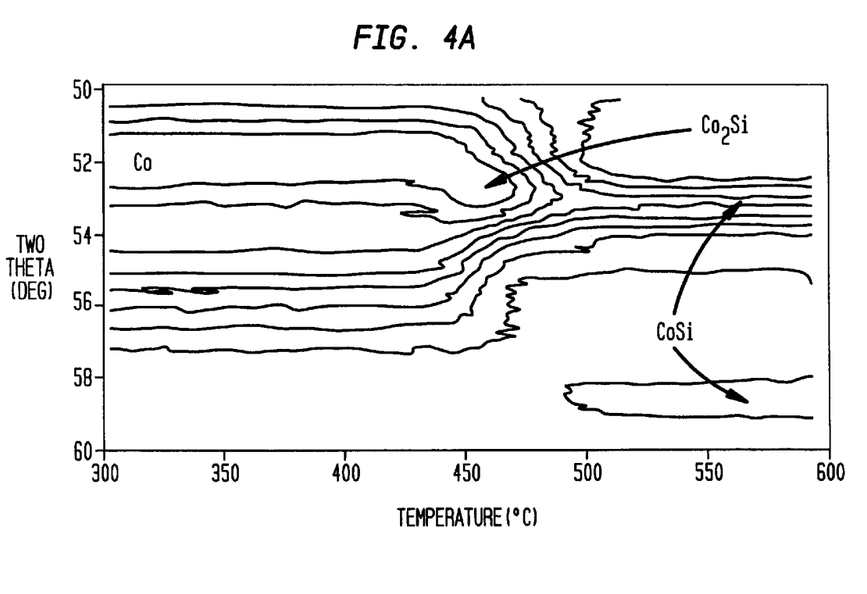
FIGS. 4A–4B are X-ray diffraction analysis as a function of temperature showing the $CoSi_2$ phase region for a pure Co (A), and Co—Si alloy (B) on Si substrates. Note that FIGS. 4A–4B are same as FIGS. 3A–3B except that the $Co_2Si$ range is magnified.
Figure 4B:
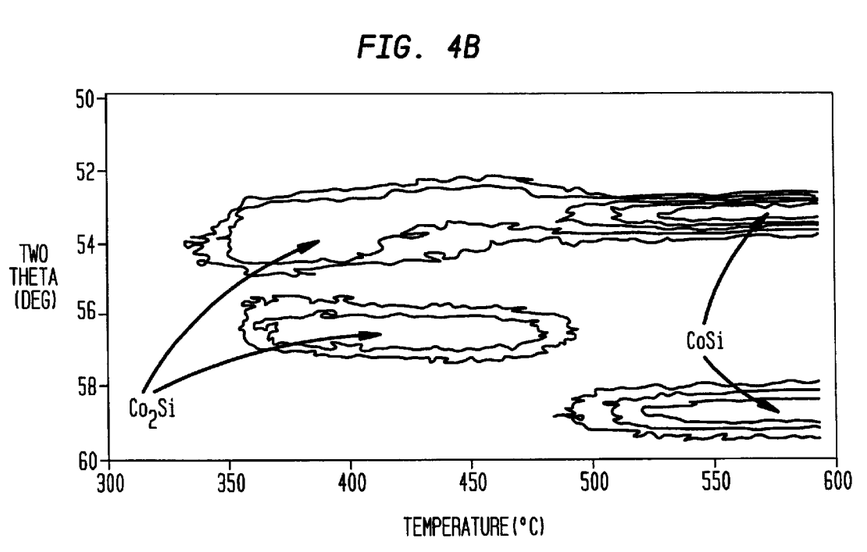

By comparison, it is clear in FIG. 3B that when a TiN capped $Co_{0.75}Si_{0.20}Ge_{0.05}$ is annealed, the disilicide formation occurs at a temperature more than 100° C. higher. The same effect is also observed for Co-Ge binary alloys. For the effect of the Si in the Co, it is somewhat difficult to see in FIGS. 3A–3B because of the high intensity of the $CoSi_2$ peak. The same data as presented in FIGS. 3A–3B is shown in FIGS. 4A–4B with a smaller temperature range (300° C. to about 600° C.) in order to point out the temperature region surrounding the metal rich phase. While for a pure Co film in FIG. 4A, the metal rich phase is present from only about 445° C. to about 475° C., ($Co_2Si$ (301) at about 52.5°) the presence of Si in the starting film extends this phase from about 360° C. to about 480° C. as seen now by the two $Co_2Si$ peaks in FIG. 4B. Therefore, the presence of the Ge does not affect the low temperature formation of the metal rich phase and the two effects can be combined as disclosed in the present invention.

Note that with a concentration of 20 atomic % Si in the Co, half the silicon needed to form the metal rich phase is already present in the material. After formation of the metal rich phase, any further reaction occurs with the blanket Si layer (because of the presence of Ge interlayer) leading to a dramatic reduction of Si consumption in the substrate, i.e., the consumption is only 1/8 of the Si as compared to conventional salicide processes. It is important that the Co (20 atomic % Si) alloy be combined with the blanket layer of Si. The presence of 20% Si in the Co helps in forming the Co$_2$Si and in reducing the consumption of Si at early stages. The Ge provides the interface layer to retard reaction with the underlying Si while the reaction with the Si capping layer occurs. Thus, reducing the amount of Si consumption.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming an ohmic contact comprising the steps of:
   (a) forming a first layer over a semiconductor wafer including at least exposed silicon-containing areas that are not covered by an insulator, said first layer comprising a M—Si—Ge alloy, wherein M is Co, Ni or a combination of Co and Ni, Si is less than 30 atomic % and Ge is less than 20 atomic %;
   (b) first annealing of said first layer to form a metal rich silicide phase of Co$_2$Si or Ni$_x$Si$_y$ over said exposed silicon-containing area wherein x and y are integers in which x is greater than y and Ge is partly in solution and partly segregates out of said silicide phase, said segregated Ge functioning to substantially reduce silicon diffusion from said silicon-containing areas to said silicide during phase transformations in a subsequent second annealing step;
   (c) etching any unreacted M—Si—Ge alloy present on said semiconductor wafer;
   (d) foaming a blanket layer of Si over said silicide and said semiconductor wafer;
   (e) second annealing of said metal rich silicide phase to convert said metal rich silicide phase into its lowest resistance silicide phase; and
   (f) removing any remaining non-reacted Si.

2. The method of claim 1 wherein said step of first annealing is carried out at a temperature and time to cause Ge to segregate out to an interface region between said Si-containing areas and said silicide.

3. The method of claim 2 wherein said segregated Ge forms a SiGe layer between said Si-containing areas and said silicide.

4. The method of claim 1 wherein said step of forming a blanket layer of Si and said step of second annealing are performed concurrently by selecting a substrate temperature wherein silicide formation occurs in-situ during the step of forming a blanket layer of Si.

5. The method of claim 1 wherein said Si-containing substrate is selected from the group consisting of single crystal silicon, polycrystalline Si, SiGe, amorphous Si and a silicon-on-insulator.

6. The method of claim 1 wherein said first layer is formed by a deposition process selected from the group consisting of chemical-vapor deposition (CVD), plasma-assisted CVD, sputtering and evaporation.

7. The method of claim 1 wherein said M—Si—Ge alloy comprises from about 15 to about 25 atomic % Si and from about 2 to about 10 atomic % Ge.

8. The method of claim 1 wherein said M—Si—Ge alloy further includes at least one alloy additive.

9. The method of claim 8 wherein said at least one alloy additive is selected from the group consisting of C, Al, Sc, Ti, V, Cr, Mn, Fe, Cu, Y, Zr, Nb, Mo, Ru, Rh, Pd, In, Sn, La, Hf, Ta, W, Re, Ir, Pt, Ce, Pr, Nd, Sm, Eu, Gd, Th, Dy, Ho, Er, Tm, Yb, Lu and mixtures thereof.

10. The method of claim 8 wherein said at least one alloy additive is C, Al, Sc, Ti, V, Cr, Mn, Fe, Cu, Y, Zr, Nb, Mo, Ru, Rh, Pd, In, Sn, La, Hf, Ta, W, Re, Ir, Pt or mixtures thereof.

11. The method of claim 8 wherein said at least one alloy additive is Ti, V, Cr, Nb, Rh, Ta, Re or mixtures thereof.

12. The method of claim 8 wherein said at least one alloy additive is present in an amount of up to about 30 atomic %.

13. The method of claim 12 wherein said at least one alloy additive is present in an amount of from about 0.1 to about 10 atomic %.

14. The method of claim 1 wherein an optional oxygen barrier layer is formed on said first layer prior to conducting step (b).

15. The method of claim 14 wherein said optional oxygen barrier layer is composed of TIN, Si$_3$N$_4$, TaN or W.

16. The method of claim 1 wherein said first annealing is carried out by a rapid thermal anneal (RTA) process.

17. The method of claim 16 wherein said RTA process is carried out in the presence of He, Ar, N$_2$ or a forming gas.

18. The method of claim 16 wherein said RTA is carried out at a temperature of from about 300° to about 700° C. for a time period of about 300 seconds of less.

19. The method of claim 1 wherein an optional cleaning process is performed between steps (c) and (d) so as to at least remove any oxide, nitride or carbon contaminants from the silicide surface.

20. The method of claim 1 wherein said blanket layer of Si is comprised of poly-Si or amorphous Si.

21. The method of claim 1 wherein said second annealing is carried out by a RTA process.

22. The method of claim 21 wherein said RTA process is carried out in the presence of He, Ar, N$_2$ or a forming gas.

23. The method of claim 21 wherein said RTA is carried out at a temperature of from about 600° to about 900° C. for a time period of about 100 seconds of less.

24. The method of claim 1 wherein step (f) includes the use of TMAH.

25. The method of claim 1 wherein said M—Ge—Si alloy is prepared by fist forming a M layer and thereafter implanting the M layer with Ge and Si.

26. The method of claim 1 wherein M is Co and during said first annealing step Co monosilicide is formed instead of said metal rich phase.

27. A method of forming an ohmic contact comprising the steps of:
   (a) forming a first blanket layer over a semiconductor wafer including at least an exposed Si—Ge alloy not covered by an insulator, said first layer comprising a M—Si alloy, wherein M is Co, Ni or a combination of Co and Ni, and Si is less than 30 atomic %;
   (b) first annealing said first layer to form a metal rich suicide phase of Co$_2$Si or Ni$_x$Si$_y$, said Si—Ge alloy functioning to substantially reduce Si diffusion from said Si—Ge alloy area to said silicide during phase transformations in a subsequent second annealing step;
   (c) etching any unreacted M—Si alloy present on said semiconductor wafer;

(d) forming a blanket layer of Si over said silicide and said semiconductor wafer;

(e) second annealing said metal rich silicide phase to covert said metal rich silicide phase into its lowest resistance silicide phase; and (f) removing any remaining non-reacted Si.

28. The method of claim 27 wherein said step of forming a blanket layer of Si and said step of second annealing are performed concurrently by selecting a substrate temperature wherein silicide formation occurs in-situ during the step of forming a blanket layer of Si.

29. The method of claim 27 wherein said first layer includes one of the following CoSiGe, NiSiGe, and CoNiSiGe and wherein during said step of first annealing, said Ge is partly in solution and partly segregates out of said silicide phase, said segregated Ge functioning to substantially reduce Si diffusion from said SiGe alloy area to said silicide during a phase transformation during a subsequent second annealing step whereby consumption of Si from said SiGe alloy area is reduced.

30. The method of claim 27 wherein said first layer is formed by a deposition process selected from the group consisting of chemical-vapor deposition (CVD), plasma-assisted CVD, sputtering and evaporation.

31. The method of claim 27 wherein said M—Si alloy comprises from about 15 to about 25 atomic % Si.

32. The method of claim 27 wherein said M—Si alloy further includes at least one alloy additive.

33. The method of claim 32 wherein said at least one alloy additive is selected from the group consisting of C, Ge, Al, Sc, Ti, V, Cr, Mn, Fe, Cu, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu and mixtures thereof.

34. The method of claim 32 wherein said at least one alloy additive is C, Ge, Al, Sc, Ti, V, Cr,Mn, Fe, Cu, Y, Zr, Nb, Mo, Ru, Rh, Pd, In, Sn, La, Hf Ta, W, Re, Ir, Pt or mixtures thereof.

35. The method of claim 32 wherein said at least one alloy additive is Ge, Ti, V, Cr, Nb, Rh, Ta, Re or mixtures thereof.

36. The method of claim 32 wherein said at least one alloy additive is present in an amount of from up to about 30 atomic %.

37. The method of claim 36 wherein said at least one alloy additive is present in an amount of from about 0.1 to about 10 atomic %.

38. The method of claim 27 wherein an optional oxygen barrier layer is formed on said first layer prior to conducting step (b).

39. The method of claim 38 wherein said optional oxygen barrier layer is composed of TIN, $Si_3N_4$, TaN or W.

40. The method of claim 27 wherein said first annealing is carried out by a rapid thermal anneal (RTA) process.

41. The method of claim 40 wherein said RTA process is carried out in the presence of He, Ar, $N_2$ or a forming gas.

42. The method of claim 40 wherein said RTA is carried out at a temperature of from about 300° to about 700° C. for a time period of about 300 seconds of less.

43. The method of claim 27 wherein an optional cleaning process is performed between steps (c) and (d) so as to at least remove any oxide, nitride or carbon contaminants from the silicide surface.

44. The method of claim 27 wherein said blanket layer of Si is comprised of poly-Si or amorphous Si.

45. The method of claim 27 wherein said second annealing is carried out by a RTA process.

46. The method of claim 45 wherein said RTA process is carried out in the presence of He, Ar, $N_2$ or a forming gas.

47. The method of claim 45 wherein said RTA is carried out at a temperature of from about 600° to about 900° C. for a time period of about 100 seconds of less.

48. The method of claim 27 wherein step (f) includes the use of TMAH.

49. The method of claim 27 wherein said Si—Ge alloy is prepared by ion implanting Ge into a Si-containing substrate.

50. The method of claim 27 wherein M is Co and during said first annealing step Co monosilicide is formed instead of said metal rich phase.

* * * * *

UNITED STATES PATENT AND TRADEMARK OFFICE
CERTIFICATE OF CORRECTION

PATENT NO. : 6,444,578 B1
DATED : September 3, 2003
INVENTOR(S) : C. Cabral et al.

It is certified that error appears in the above-identified patent and that said Letters Patent is hereby corrected as shown below:

Column 2,
Line 20, "i,e." should read -- i.e --
Line 30, "art" should read -- are --
Line 48, "ureacted" should read -- unreacted --
Line 53, "phase Any" should read -- phase. Any --
Line 54, "preset" should read -- present --
Line 54, "fob" should read -- forming --
Line 55, "opting trough" should read -- opening through --
Line 64, "whew" should read -- when --

Column 3,
Line 2, "Is" should read -- is --
Line 65, "art For" should read -- art. For --

Column 4,
Line 20, "FIG B" should read -- FIG 1B --
Line 57, "preferred mixtures" should read -- preferred. Mixtures --

Column 7,
Line 35, "Th" should read -- Tb --

Column 8,
Line 11, "phase fee" should read -- phase --
Line 29, "$SiO_{0.20}$" should read -- $Si_{0.20}$ --
Line 29, "as alloy" should read -- alloy --

Column 9,
Line 41, "foaming" should read -- forming --

Column 10,
Line 62, "suicide" should read -- silicide --

Column 11,
Line 32, "Th" should read -- Tb --
Line 36, "Hf Ta" should read -- Hf, Ta --

UNITED STATES PATENT AND TRADEMARK OFFICE
CERTIFICATE OF CORRECTION

PATENT NO.   : 6,444,578 B1
DATED        : September 3, 2003
INVENTOR(S)  : C. Cabral et al.

It is certified that error appears in the above-identified patent and that said Letters Patent is hereby corrected as shown below:

<u>Column 12,</u>
Line 11, "TIN" should read -- TiN --

Signed and Sealed this

Twenty-second Day of April, 2003

JAMES E. ROGAN
*Director of the United States Patent and Trademark Office*